(12) United States Patent
Schönhense et al.

(10) Patent No.: US 6,737,647 B2
(45) Date of Patent: May 18, 2004

(54) ARRAY FOR ACHROMATIC IMAGING OF A PULSED PARTICLE BEAM

(76) Inventors: Gerd Schönhense, Alexander-Fleming-Strasse 65, D-55130 Mainz (DE); Heinrich Spiecker, Im Pferdebroch 8, D-33619 Bielefeld (DE)

( * ) Notice: Subject to any disclaimer, the term of this patent is extended or adjusted under 35 U.S.C. 154(b) by 0 days.

(21) Appl. No.: 10/418,231

(22) Filed: Apr. 17, 2003

(65) Prior Publication Data

US 2004/0000646 A1 Jan. 1, 2004

(30) Foreign Application Priority Data

Apr. 19, 2002 (DE) .......... 102 17 507

(51) Int. Cl.⁷ .......... H01J 37/05; H01J 37/12
(52) U.S. Cl. .......... 250/310; 250/311; 250/396 R; 250/398
(58) Field of Search .......... 250/310, 311, 250/396 R, 398

(56) References Cited

U.S. PATENT DOCUMENTS

| | | |
|---|---|---|
| 2,354,287 A | 7/1944 | Zworykin et al. |
| 3,896,331 A * | 7/1975 | Enck et al. .......... 315/17 |
| 5,196,708 A | 3/1993 | Mullock |

FOREIGN PATENT DOCUMENTS

DE 44 42 348 5/1996

OTHER PUBLICATIONS

Scherzer's theorem (O. Scherzer Z. f. Physik 101 (1936) p. 593.
Optik 2, O. Scherzer (1947) p. 115.
Principles of Electron Optics, Hawkes and Kasper Academic Press 1996, vol. 2, p. 857 ff.
Nature 392, M. Haider et al (1998) p. 768.
Microsc. Microanal. 3 G. F. Rempfer et al (1997) p. 14.
Journal of El. Spectrosc. Relat. Phenom. 84 R. Fink et al (1997) p. 231.
Principles of Electron Optics, Hawkes and Kasper Academic Press 1996, vol. 2, p. 872 ff.
Time–of–Flight Mass Spectrometer with Improved Resolution W.C. Wiley and I.H. McLaren (1955) pp. 1150–1157.

* cited by examiner

Primary Examiner—Nikita Wells
(74) Attorney, Agent, or Firm—Jordan and Hamburg LLP

(57) ABSTRACT

An array for achromatic imaging of a pulsed beam of charged particles is described. The device comprises an imaging system with a round lens optics (2, 7), a low-energy drift space (3) and an accelerator (4-6) driven by at least one rapidly switchable voltage U(t), such that the velocity and/or trajectory of the particles in the beam is influenced and the particles starting from point (1) with different energies are crossing the image plane in one point (8), i.e. the chromatic aberration of the optics is compensated.

15 Claims, 3 Drawing Sheets

ARRAY FOR ACHROMATIC IMAGING OF A PULSED PARTICLE BEAM

CROSS-REFERENCE TO RELATED APPLICATIONS

This application claims Priority from German Application No. DE 102 17 507.1 filed on Apr. 19, 2002.

FIELD OF THE INVENTION

The present invention describes an array imaging a pulsed particle beam emitted from at least one point on a sample on to a detector.

It is known that so-called particle lenses, i.e. lenses for charged particles like electrons can influence the paths of these particles in a similar way as an optical lens influences photon rays.

Such particle lenses are applied e.g. in electron microscopes. The chromatic and spherical aberrations of particle lenses are the main factors limiting spatial resolution. Astigmatism is the result of misalignment and can be compensated by electric or magnetic stigmators and correcting image curvature which is often of secondary importance. However, the chromatic and spherical aberrations constitute a basic problem for all optical systems composed of round lenses.

The chromatic aberration is caused by the different energies of the particles in the beam and results in the fact that particles of different energy do not intersect the ideal image point. In other words: due to the chromatic aberration particles with different energy hit the image plane in different positions.

In contrast to photon optics these aberrations cannot be corrected by suitable lens combinations. The reason is that, independent of type and geometry of the selected lens, all particle optical round lenses are characterized by spherical and chromatic aberration coefficients c, and $c_c$, respectively, that are always positive. Thus, the combination of lenses with coefficients with different sign in a lens system of round lenses is impossible.

DESCRIPTION OF THE PRIOR ART

This fundamental property of all optical round lenses for particles is known as Scherzer's theorem [O. Scherzer, Z. f ür Physik 101 (1936) 593].

Scherzer [O. Scherzer, Optik 2, 115 (1947)] and other authors have searched for ways to circumvent this theorem and discussed different possibilities for the correction of c, and $c_c$.

An overview is given by Hawkes and Kasper [Principles of Electron Optics, Academic Press 1996, Vol. 2, p. 857ff]. The conditions for the validity of Scherzer's theorem are: round lenses, real images, static fields, no space charge, no potential jumps. These conditions imply possibilities to circumvent the theorem. Despite numerous attempts with different methods, only the use of multipole correctors in high-resolution transmission electron microscopes has been successful up to now [M. Haider, S. Uhlemann, B. Schwan, H. Rose, B. Kabius, K. Urban, Nature 392 (1998) 768]. A second possibility of aberration correction by means of electron mirrors was proposed and is being tested [G. F. Rempfer et al., Microsc. Microanal. 3 (1997) 14; R. Fink et al., Journal of El. Spectrosc. Relat. Phenom. 84 (1997) 231]. These methods pose a high challenge on the mechanical precision and the current or voltage stability of the electronics. In addition, the adjustment is very demanding, in particular in the case of the non-linear optical axis connected with the solution of the electron mirror.

Several authors discussed the application of so-called high-frequency lenses [Hawkes and Kasper, Principles of Electron Optics, Academic Press 1996, Vo., 2, p. 872 ff], where the lens is formed by a micro wave resonator or the resonator is integrated into a lens. It turned out that the phase condition (i.e., the relation between the phase of the micro wave and the phase of the electron bunch when entering the resonator) and the dwell time in the resonator plays a crucial role. None of the proposals in connection with high-frequency lenses has been realized successfully.

In reference (U.S. Pat. No. 5,196,708 A) a particle source is described that produces a pulsed particle beam in a way that the particles belonging to a bunch experience a pulsed electrical field in a so-called "buncher" synchronized with the pulses. This pulsed electrical field causes an acceleration of the electrons at the end of the bunch. This acceleration causes a desired shortening of the axial expansion of the particle formation. This axial compression can be used for imaging with reduced chromatic aberration. This energy focussing effect using a pulsed axial electrical field is also known from time-of-flight mass spectroscopy (Rev. Sci. Instr. 26(1955) 12, 1150-7 (Wiley. W.C.: McLaren. I.H.), section on time-lag energy focussing, p. 1154. The reduction of flight-time differences by pulsed fields can also be exploited for an improvement of the mass resolution of a time-of-flight mass spectrometer. (DE 44 42 348 A1). These methods cause a temporal and spatial compression of the particle ensemble at the target (called bunching effect in reference U.S. Pat. No. 5,196,708 A).

The contribution of the chromatic aberration to the total resolution of an optical system is given by $$\delta_c = c_c \alpha \Delta E/E$$

where $c_c$ is the chromatic aberration coefficient dependent on lens geometry and energy, $\alpha$ is the beam pencil angle accepted by the contrast aperture and $\Delta E/E$ is the relative width of the energy distribution of the imaged charged particles with centre of gravity at energy E.

BRIEF SUMMARY OF THE INVENTION

It is an object of the present invention to provide a device that enables correction of the chromatic aberration of a system of round lenses for charged particles, but wherein the complexity of the arrangement is greatly reduced. This is achieved via energy dependent axial expansion, i.e. energetic dispersion, of the pulsed particle beam in a low-energy drift space.

According to a first aspect of the present invention, an arrangement for imaging of a pulsed particle beam from a sample to a detector with minimized chromatic aberration comprises: an imaging system with particle optical round lens optics, a low-energy part of the optics called drift space, means for application of a rapidly switched voltage such that the velocity of the particles of the beam is changed in a way that the particle rays starting in one point on the sample intersect the image plane in one point thus leading to a reduction of the chromatic aberration in the image. To achieve this, the fastest particles reach the end of the drift space before the switching of the electrical field and are thus not influenced by the field. The slower particles, however, are accelerated by the application of a suitable voltage in a way that the energy gain is proportional to the local potential in the moment when the voltage is switched on. Their energy gain is the higher, the slower the particle has been on its way through the round lens optics. This means that the particles at the front of the beam retain their energy, whereas the particles in the centre of the beam gain a higher kinetic energy and the particles at the end of the beam gain the highest kinetic energy.

The energy distribution of the particle beam can be inverted if a parabolic potential is applied. As the originally fastest particles retain their velocity or energy, however the slowest particles are also accelerated to a new energy higher than the originally fastest particles, the chromatic aberration of the following round lens optic can compensate the chromatic aberration of the preceding part of the optics. The particles are intersecting in the same image point, i.e. the total chromatic aberration vanishes in the sense that all particle rays intersect in the ideal image point. This implies that the voltage has to be switched in the moment when the particle beam is in the accelerator at the end of the drift space. Further advantages are described in the claims.

According to a special embodiment of this first aspect of the invention, the particles in a particle beam can be decelerated by a retarding voltage and dispersed in a subsequent low-energy drift space such that the distance between particles with different energies is increased. This deceleration of the particles by means of the to retarding voltage retains the velocity differences between the different particles but reduces the average velocity of the beam. Hence, electrons with different velocities gain distance from each other. Behind the drift space the particles experience an energy increase in the pulsed accelerator such that the slower particles gain more velocity than the faster ones. Consequently, all particle rays intersect in the ideal image point leading to a vanishing chromatic aberration as described above.

According to a second aspect of the present invention, an arrangement for imaging of a pulsed particle beam from at least one point of several points on a sample comprises: an imaging system with particle optical round lens optics, a low-energy drift space increasing the spatial and temporal distance between the particles of the particle ensemble with different velocities such that after passing of the particles through the drift space the refractive power of the round lens optics behind the drift space is adapted at each moment such that the focal width of the optics remains the same for all particle energies and such that all particle energies of the beam are imaged with the same magnification on the screen. Consequently, the chromatic aberration is eliminated in the image.

Further advantages of this second aspect of the present invention are described in the claims.

The visualization of the particle-optical image requires a detector. Such a detector can comprise a fluorescent screen and a CCD-camera that acquires the image. Alternatively, the detector can be designed such that all particles are individually detected and registered with respect to their spatial coordinate and arrival time on the detector. This bears a number of advantages: it provides the mode of energy-resolved imaging of the particles or the possibility of imaging of selected particle energies such that the partial images corresponding to different energies can be adjusted in scale resulting in a sharp image. The adjustment of the partial images taken at different energies to the same scale requires compression, expansion, rotation or displacement of each partial image by means of suitable image acquisition software. Furthermore, this procedure allows compensating the influence of spurious stray fields.

Of particular advantage is the application of both aspects of the present patent in an arrangement imaging pulsed particle beams emitted from a sample in an electron or an ion microscope or in optics for projection lithography. It can also be exploited in the generation of pulsed electron or ion microprobes.

BRIEF DESCRIPTION OF THE SEVERAL VIEWS OF THE DRAWING

In the following, the invention will be described in more detail with reference to the accompanying Figures, in which.

DETAILED DESCRIPTION OF THE INVENTION

Figure 1:
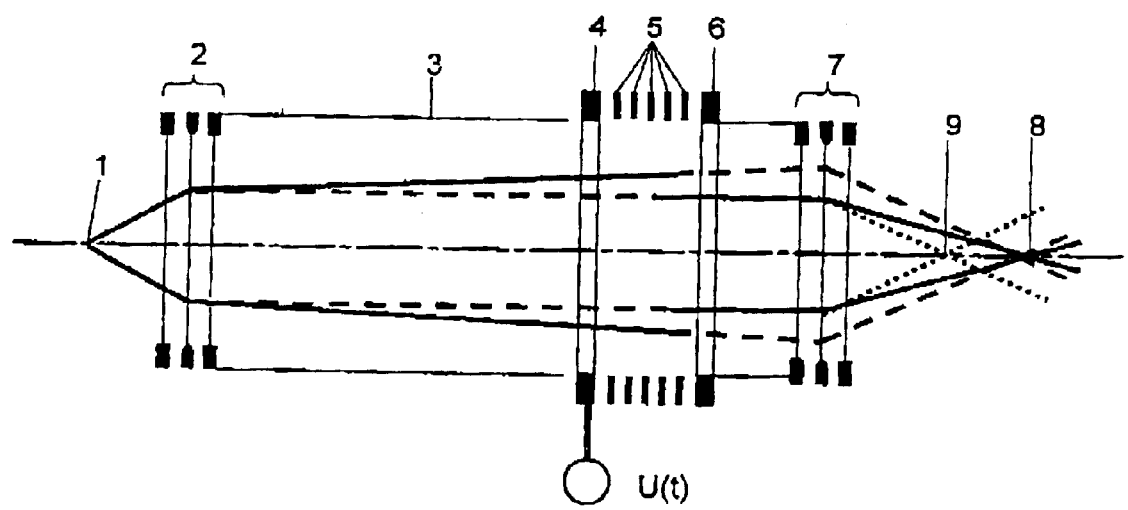
FIG. 1 is a schematic drawing of the corrector.
Figure 2:
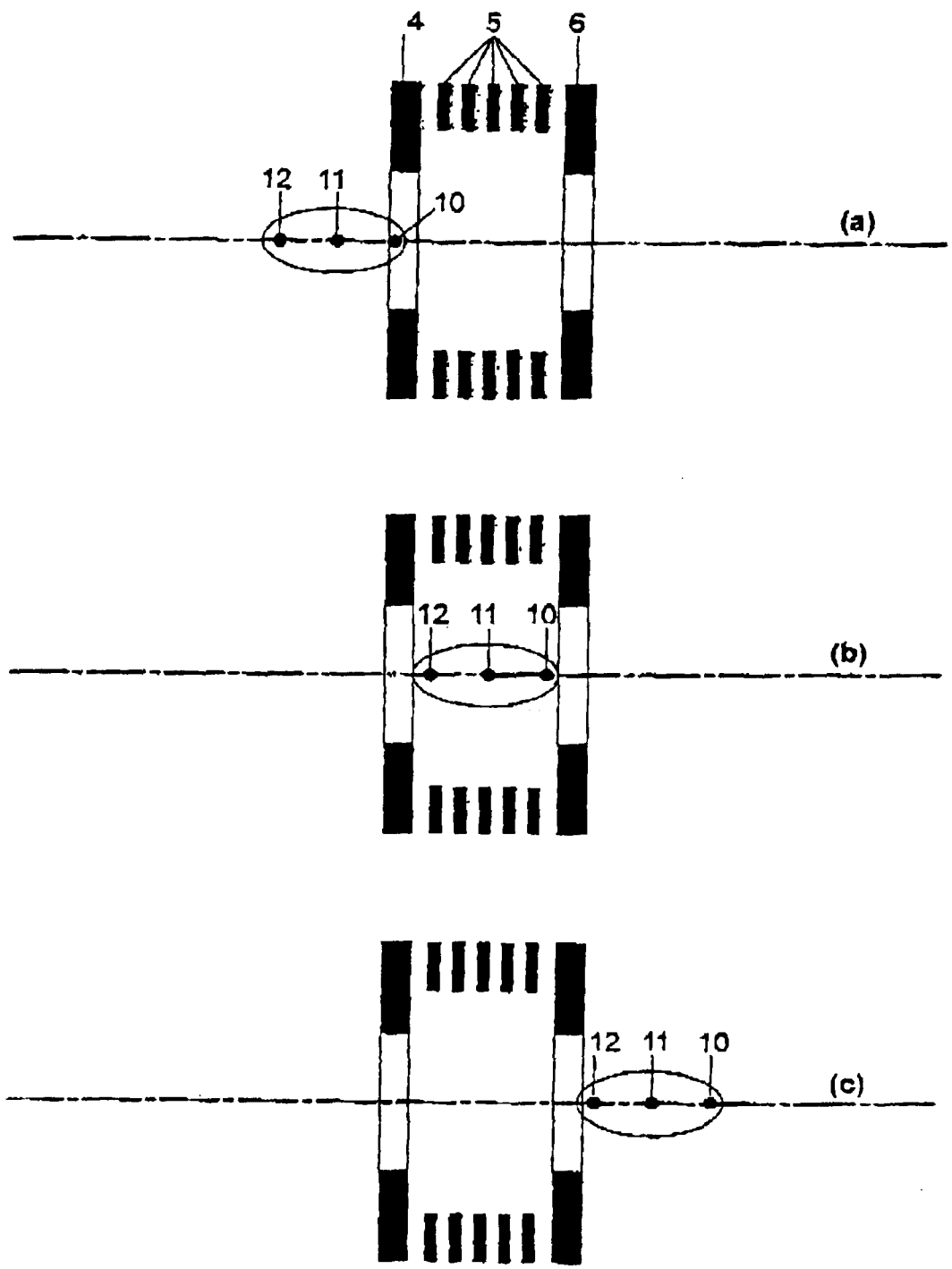
FIGS. 2a–c shows the accelerator inverting the energy distribution with the transmitted particle beam at three different times.

Referring to FIGS. 1 and 2, a preferred embodiment of the imaging device in accordance with the invention is a particle optical round lens system including a low-energy drift space and an electrostatic accelerator such that a rapidly switched axial electric field induces an inversion of the energy distribution of the particles. Particles with energy $E_0$ are focussed to the correct image plane. Without corrector, particles with higher energy are deflected too weakly by the round lenses. Hence, their focal plane is shifted to higher z-values along the optical axis. The corresponding chromatic aberration coefficient $c_c$ is thus always positive. In contrast to photon optics, this is the reason that no achromatic optical round lens system for charged particles can be constructed.

In FIG. 1 the accelerator consisting of electrodes 4, 5 and 6 is inserted between lens 2, drift tube 3 and lens 7. The operating principle exploits that a particle beam with an energy width $\Delta E$ is expanded in a low-energy drift space 3 as a consequence of the different velocities of the particles (dispersion). This dispersion is linear in velocity v, i.e. quadratic in energy ($E = mv^2/2$). After passing the drift space the particles have a spatial distribution as shown in FIG. 2a. The fastest particles 10 with energy $E_0$ define the front side of the beam particles 11 correspond to an average energy and the slowest particles 12 with energy $E_0$ define the end of the beam. This spatial configuration of the particles resulting from the dispersion effect enters the accelerator, as shown in FIG. 2b. At this moment the voltage U(t) at the entrance electrode 4 is rapidly varied by the value $\Delta U$ i.e. to negative or positive values for electrons or for positively charged ions, respectively. This voltage gives rise to the electrical field F. Its propagation with the speed of light can be neglected in comparison with the relevant flight times of the particles. Further consideration reveals that an axial change of the electrical field is connected with a ring-shaped magnetic field. In contrast to magnetostatic lenses this causes no energy-dependent image rotation. This is an advantage of the device even at extremely high frequencies.

Calculations reveal that in the case of rapidly switched electrostatic lenses an additional lens action arises due to the induced magnetic ring field. At typical switching times and geometries, this lens action can be neglected in comparison with the electrostatic lens action.

The fastest particles 10, i.e. those particles that have reached the centre of the exit electrode 6, cf. FIG. 2b, are not influenced by the electric field. However, the slower particles 11 and 12 experience an energy gain during their travel through the remaining part of the accelerator. This energy gain is defined by the local potential at the moment $t = t_s$. We consider the example $\Delta U = 2 \Delta E / e$. In this case the slowest particles 12 that have reached the plane of the entrance electrode 4 at the switching time $t = t_s$, are lifted by the energy value $2 \Delta E$, because they have to travel along the complete accelerating field. Analogously, the centre particles 11 are accelerated by a smaller energy value, since they travel only across the second half of the accelerating field. After leaving the accelerator, cf. FIG. 2c, the energy distribution is thus inverted. The particles at the front of the bunch 10 have the unchanged energy $E_0$, the particles in the centre of the bunch 11 have a higher energy and the particles at the end of the bunch 12 have the new energy $E_0 + \Delta E$.

Variation of the voltage jump $\Delta U$ facilitates a non-symmetrical inversion of the energy distribution behind the drift space, i.e. the new energy of particles 12 is $E_0 + x\Delta E$. This case can be advantageous for a given lens configuration. Furthermore, the example shown in FIG. 2b, where the particle ensemble fills the whole accelerator at the time $t = t_s$ is no necessary condition of the method. In each case, however, the initially slowest particles 12 are the fastest particles after passing the accelerator. The electrode arrangement 5 serves for fringe-field correction. In the common way for electrostatic accelerators these electrodes define the desired voltage drop, e.g. by means of a resistor chain connecting the electrodes with each other and with the ends of the accelerator, i.e. electrodes 4 and 6. The accelerating field can be parabolic in a preferred embodiment. Alternatively, in order to obtain better particle optical properties, it can deviate from this simple structure by means of suitably shaped electrodes and by the temporal behavior of the voltage rise. For the basic operation of the accelerator the exact shape of the field is of secondary importance.

FIG. 1 shows a preferred embodiment of the chromatic corrector in a particle optical system consisting of two coverging lenses 2 and 7. In this example the particle ensemble starting from the source point 1 is converted to an approximately parallel beam by the first lens 2. In the drift space 3 the ensemble is expanded due to its energy width $\Delta E$ before it passes the accelerator consisting of entrance electrode 4, correction electrodes 5 and exit electrode 6, followed by the second lens 7 that focuses the ensemble to the image point 8. As a consequence of the chromatic aberration of the first lens 2 the low-energy particles (dashed trajectories) are refracted more strongly than the high-energy particles (solid trajectories). Owing to the inversion of the energy distribution of the particles when passing the accelerator as described above, the initially low-energy particles are converted to the high-energy particles, as indicated by interchanging the full and dashed trajectories. The second lens 7 again acts more strongly on the low-energy particles due to its chromatic aberration, such that now the chromatic aberration of the first lens 2 is compensated. All trajectories cross in the ideal image point 8. Without correction, the inner rays always correspond to the low-energy particles and the second lens 7 again acts more strongly on these particles, resulting in the dotted trajectories. The sum of lens 2 and lens 7 exhibits a significant chromatic aberration without corrector (image points 8 and 9) and no aberration with active corrector (only 8).

Figure 3:
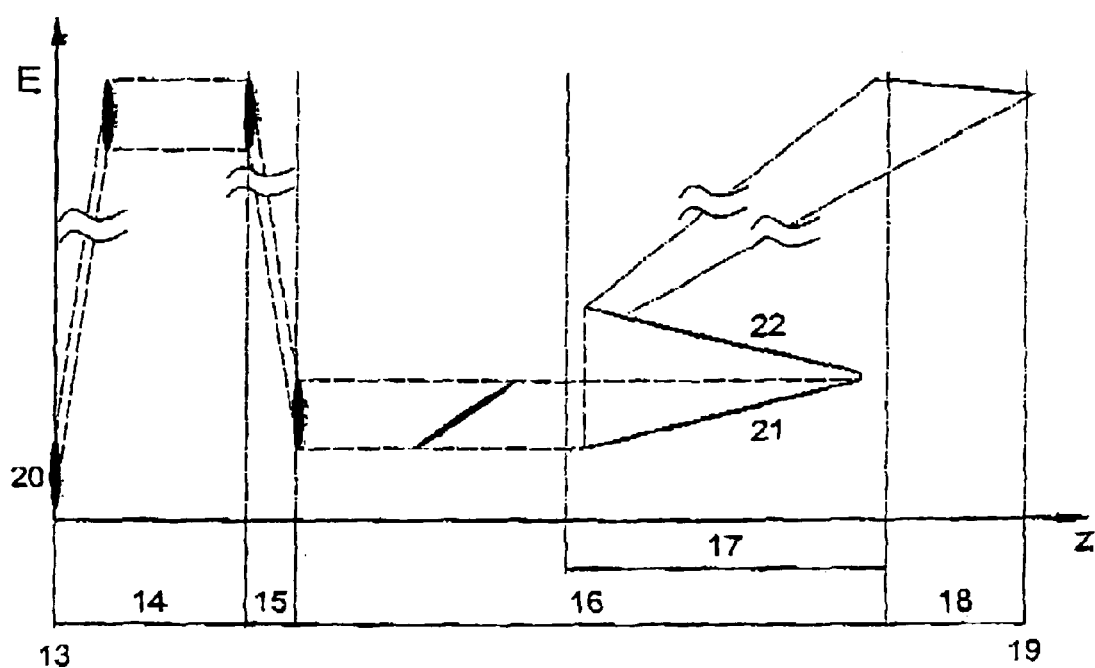
FIG. 3 is a schematic drawing of the energy-versus-path distribution of the particles within the round lens optics or the column of the microscope.

FIG. 3 further illustrates the preferred embodiment of the invention by means of a schematic diagram of the energy-versus-optical path distribution. The beam starting from the sample 13 is transported by the round lens optics 14, then decelerated in the retarding space 15, then axially expanded in the drift space 16 such that the expanded ensemble 21 enters the accelerator 17 at the end of the drift space. The switched voltage in the accelerator 17 lifts the low-energy part of the particle beam, resulting in an inversion of its energy distribution, see distribution 22. The final part of the imaging optics 18 utilizes this inversion for the correction of the chromatic aberration such that a sharp image appears on the detector 19.

List of Numerals

1. Source point
2. First lens
3. Low-energy drift space
4. Entrance electrode of the accelerator
5. Corrector electrodes of the accelerator
6. Exit electrode of the accelerator
7. Second lens
8. Image point of all particles with active corrector
9. Image point of the slowest particles without corrector
10. Particles with maximum energy before correction
11. Particles with medium energy before correction
12. Particles with lowest energy before correction
13. Position of the sample
14. First imaging optics
15. Deceleration optics
16. Low-energy drift space
17. Rapidly switchable accelerator
18. Second imaging optics
19. Image plane with detector
20. Energy-versus-path distribution of the particles at the sample
21. Energy-versus-path distribution of the particles before the inversion
22. Energy-versus-path distribution of the particles after the inversion U(t) pulsed voltage

We claim:

1. An array for achromatic imaging of a pulsed particle beam comprising: means for imaging containing at least two particle-optical round lenses 2, 7, a low-energy drift space 3 that gives rise to an energy-dependent axial expansion of the particle beam and means for changing the energy distribution of the particle beam located between the drift space and the second lens 7 such that an electrode arrangement (4, 5, 6) facilitates the generation of a pulsed axial electric field.

2. An array according to claim 1 in which the particles within the particle beam are decelerated by a retarding voltage before entering the drift space.

3. An array according to claim 1 in which the energy distribution of the particle beam is inverted by a rapidly switchable voltage.

4. An array according to claim 1 in which the energy distribution of the particle beam is inverted except for a scaling factor by means of a rapidly switchable voltage.

5. An array according to claim 1 in that the particle beam is emitted from a sample 13 to a detector 19.

6. An array for achromatic imaging of a pulsed particle beam comprising: an imaging system with at least one particle optical round lens (7), a preceding low-energy drift space (3) for energy-dependent axial expansion of the particle beam, such that the focal width of the round lenses (7) is actively varied during the passage of the particle beam such that well-focused imaging is obtained for all particle energies.

7. An array according to claim 6 in which the round-lens optics is actively varied such that all particle energies of the beam are imaged to the screen with identical magnification.

8. An array according to claim 6 in which the partial images corresponding to different particle energies are separately recorded and are adjusted to each other by means of numerical procedures.

9. An array according to claim 6 in which the detector is a fluorescent screen.

10. An array according to claim 6 in which the detector selects a time window out of the particle beam being imaged such that the pulse length is restricted and the aberrations can be corrected.

11. An array according to claim 6 in which the detector registers the space coordinate and arrival time of the particles individually.

12. An array according to claim 6 in which the detector is a CCD-camera.

13. An array according to claims 1 or 6 in which the particles are electrons or ions.

14. An array according to claims 1 or 6 that is part of an electron microscope, an ion microscope, an instrument for projection lithography or an electron- or ion-microprobe.

15. An array according to claim 6 in that the particle beam is emitted from a sample 13 to a detector 19.

* * * * *